(12) United States Patent
Morita

(10) Patent No.: US 6,634,094 B1
(45) Date of Patent: Oct. 21, 2003

(54) APPARATUS FOR MOUNTING ELECTRONIC PARTS

(75) Inventor: Tadashi Morita, Aichi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/562,451

(22) Filed: May 2, 2000

(30) Foreign Application Priority Data

May 11, 1999 (JP) .......................................... P11-129353

(51) Int. Cl.[7] ................................................. H05K 3/30
(52) U.S. Cl. ........................... 29/740; 29/739; 29/832; 700/241
(58) Field of Search .................... 29/832, 739, 740, 29/741; 700/241

(56) References Cited

U.S. PATENT DOCUMENTS

| | | | |
|---|---|---|---|
| 5,706,576 A | * | 1/1998 | Iwasaki et al. ................ 29/703 |
| 6,079,098 A | * | 6/2000 | Soellner et al. ................ 29/739 |
| 6,223,428 B1 | * | 5/2001 | Nonaka et al. ................ 29/832 |
| 6,301,508 B1 | * | 10/2001 | Matsuura ...................... 700/20 |

* cited by examiner

*Primary Examiner*—Richard Chang
(74) *Attorney, Agent, or Firm*—Ronald P. Kananen; Rader, Fishman & Grauer PLLC

(57) ABSTRACT

An apparatus for mounting electronic parts enhancing the versatility in the operation for mounting electronic parts and facilitating the operation and maintenance. The apparatus for mounting electronic parts includes four electronic parts-mounting units, means for conveying a mounting board, and a communications system for communication among the mounting units. Each mounting unit includes a communication portion for inputting/outputting data to and from the communications system, a selection filter for selectively obtaining sequence data related to the preset machine logic number from the input sequence data, and an operation control unit for controlling the operation for mounting electronic parts based on the obtained sequence data. The mounting unit works as a parent unit to receive a systematic control function of the whole apparatus, and the mounting units work as child units. The mounting unit working as the parent unit includes a data base storing a plurality of data sequences, and a sequence compiler incorporating a link control soft program for controlling the electronic parts-mounting units that work as child units.

6 Claims, 3 Drawing Sheets

APPARATUS FOR MOUNTING ELECTRONIC PARTS

BACKGROUND OF THE INVENTION

1. Field of the Invention

The present invention relates to an apparatus for mounting electronic parts on a mounting board and, more specifically, to an apparatus for mounting electronic parts enhancing the versatility in the mounting operation and facilitating the operation and maintenance.

2. Description of the Related Art

The operation for mounting chips such as semiconductor devices, resistors and capacitors on a mounting board has been automatically carried out by using an apparatus for mounting electronic parts.

A conventional apparatus 1 for mounting electronic parts has been constituted by, as shown in FIG. 1, a plurality of electronic parts-mounting units, for example, by four electronic parts-mounting units 2A to 2D to mount required electronic parts on a mounting board conveyed by a conveyer means 3 through a series of mounting operations. In the apparatus 1 for mounting electronic parts, for example, the electronic parts-mounting unit 2A mounts a semiconductor device, the electronic parts-mounting unit 2B mounts another semiconductor device, the electronic parts-mounting unit 2C mounts a resistor and, finally, the electronic parts-mounting unit 2D mounts a capacitor on the mounting board to thereby fabricate a desired electronic device.

The plurality of electronic parts-mounting units 2 constituting the electronic part mounting apparatus 1 are mechanically linked together through means for conveying electronic parts, but are individually controlled by inserting recording media such as floppy disks in each of the electronic parts-mounting units 2, the floppy disks storing data for the mounting operation for each of the electronic parts-mounting units 2, so that the data stored in the floppy disks are read out to individually control the units based upon the data.

If further described, a software for assigning the mounting operations to each of the electronic parts-mounting units 2 is incorporated in a separate arithmetic unit in which the sequence data are so divided that the mounting operations are assigned to the electronic parts-mounting units 2 maintaining as good balance as possible, and the data are downloaded in the form of floppy disks on each of the electronic parts-mounting units. The sequence data are for controlling the operation at the time of causing the electronic parts-mounting units to execute the mounting operations.

According to the conventional apparatus for mounting electronic parts, however, the sequence data must be managed for each of the electronic parts-mounting units as described above. When it is attempted to change the balance of operation by changing the ratio of mounting operations among the electronic parts-mounting units, however, sequence data must be newly and separately provided for each of the electronic parts-mounting units.

Further, it often becomes necessary to change the ratio of mounting operation among the electronic parts-mounting units, and separately and newly preparing the sequence data each time for each of the electronic parts-mounting units is a time-consuming and laborious work hindering the effort for improving the efficiency of mounting operation. This further imposes limitation on the versatility of operation of the electronic parts-mounting units, making the operation and maintenance difficult.

SUMMARY OF THE INVENTION

The object of the present invention is to provide an apparatus for mounting electronic parts which is capable of conducting a versatile mounting operation in mounting the electronic parts, facilitating the operation and maintenance.

According to the present invention, there is provided an apparatus for mounting electronic parts comprising:

a plurality of electronic parts-mounting units for mounting predetermined electronic parts on a mounting board at predetermined positions;

a communications means for connecting said plurality of electronic parts-mounting units; and an operation control unit for outputting machine logic numbers and electronic parts numbers of each of said mounting units to said communication means; wherein the mounting sequences of the units are controlled by specifying the machine logic numbers of the units.

The electronic parts-mounting units have the mechanical and control constitutions the same as those of the prior art in addition to the constitution specified by the invention, and are linked to each other by a mounting board conveyer means of a known constitution.

The communications system stands for a network, and the electronic parts-mounting units are electrically connected together through a network cable.

According to the present invention, the same sequence data are prepared and each of the electronic parts-mounting units obtains the required sequence data from the above sequence data through selection filters. Therefore, the sequence data can be easily prepared, and the mounting operation can be distributed maintaining good balance among the electronic parts-mounting units.

Further, the communications mechanism, control mechanism and data structure are so constituted that a group of electronic parts-mounting units linked together are operated as a single unit by a sequence of data, making it possible to improve the production efficiency of the electronic parts-mounting unit, to broaden the compatibility of mounting operations of the electronic parts-mounting units and to improve the versatility in the mounting operations of the electronic parts-mounting units.

A preferred embodiment of the invention exhibits a communications function for declaring one of the electronic parts-mounting units linked together to be a parent unit and permitting all electronic parts-mounting units inclusive of the parent unit itself to work in cooperation with the parent unit, and a child unit control function for controlling the operations of the child units.

More preferably, the parent unit includes a sequence compiler which allocates sequence data to the child units based on the machine logic numbers and incorporates a link control soft program for maintaining a balance of production, wherein the same sequence data are transmitted to all child units inclusive of the parent unit, and the child units read the portions that meet their own machine logic numbers from the sequence data through selection filters to execute the sequence.

The electronic parts-mounting units constituting the apparatus for mounting electronic parts need not all be equipped with a sequence compiler, and any one of the electronic parts-mounting units equipped with the sequence compiler declares to be a parent unit.

In the apparatus for mounting electronic parts according to the present invention, the machine logic numbers set to the electronic parts-mounting units can be freely changed.

This makes it possible to further broaden the compatibility of mounting operations among the electronic parts-mounting units and to further enhance the versatility of mounting operations of the electronic parts-mounting units.

Among the electronic parts-mounting units linked together, further, the electronic parts-mounting unit that is not being used is allowed to stand by as a spare unit. When the electronic parts-mounting unit having run out of parts to be mounted is to be changed over to the electronic parts-mounting unit that is standing by, therefore, the machine logic number of the electronic parts-mounting unit having run out of parts to be mounted is substituted for the machine logic number of the electronic parts-mounting unit that is standing by so as to be able to quickly change over the electronic parts-mounting unit.

DESCRIPTION OF THE PREFERRED EMBODIMENT

An embodiment of the invention will now be described concretely and in detail with reference to the accompanying drawings.

Figure 1:
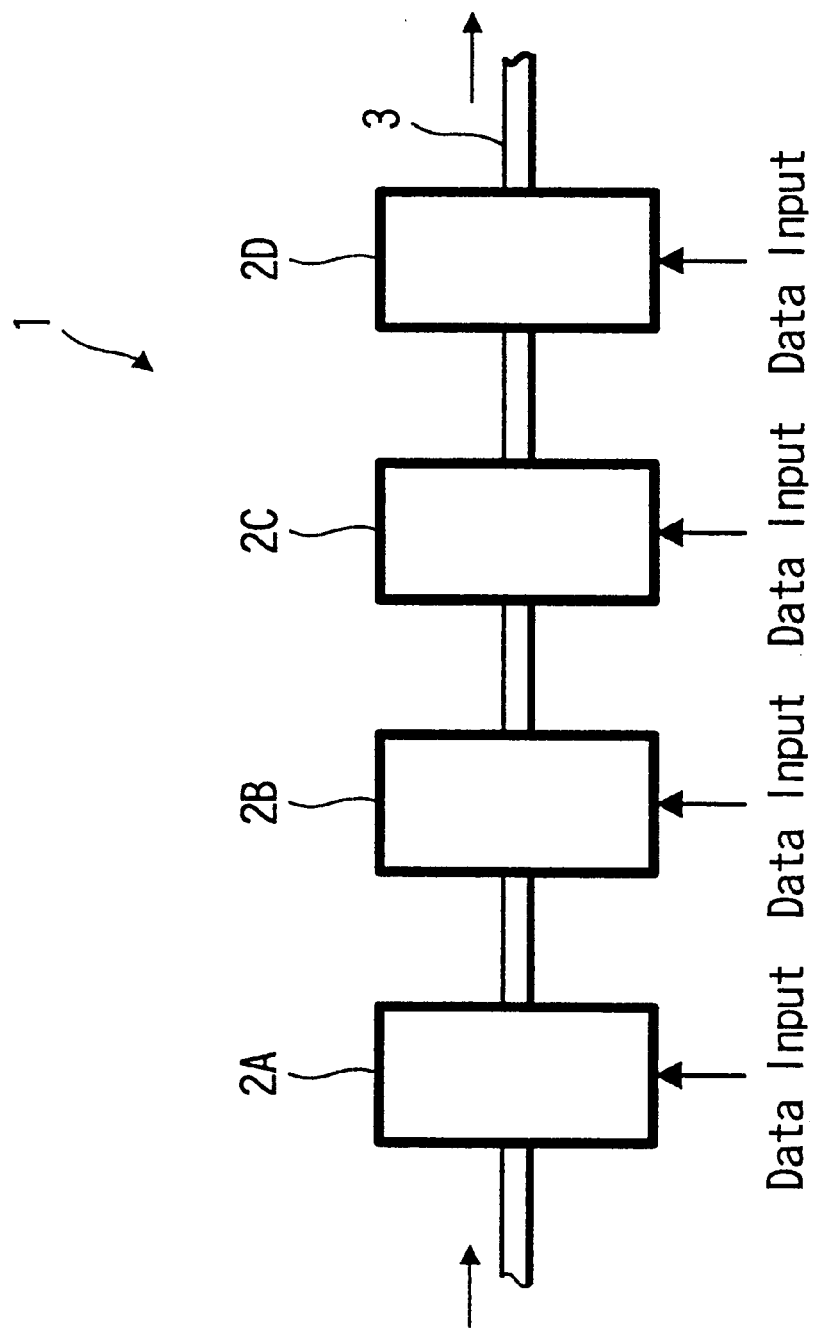
FIG. 1 is a block diagram illustrating the constitution of a conventional apparatus for mounting electronic parts.
Figure 2:
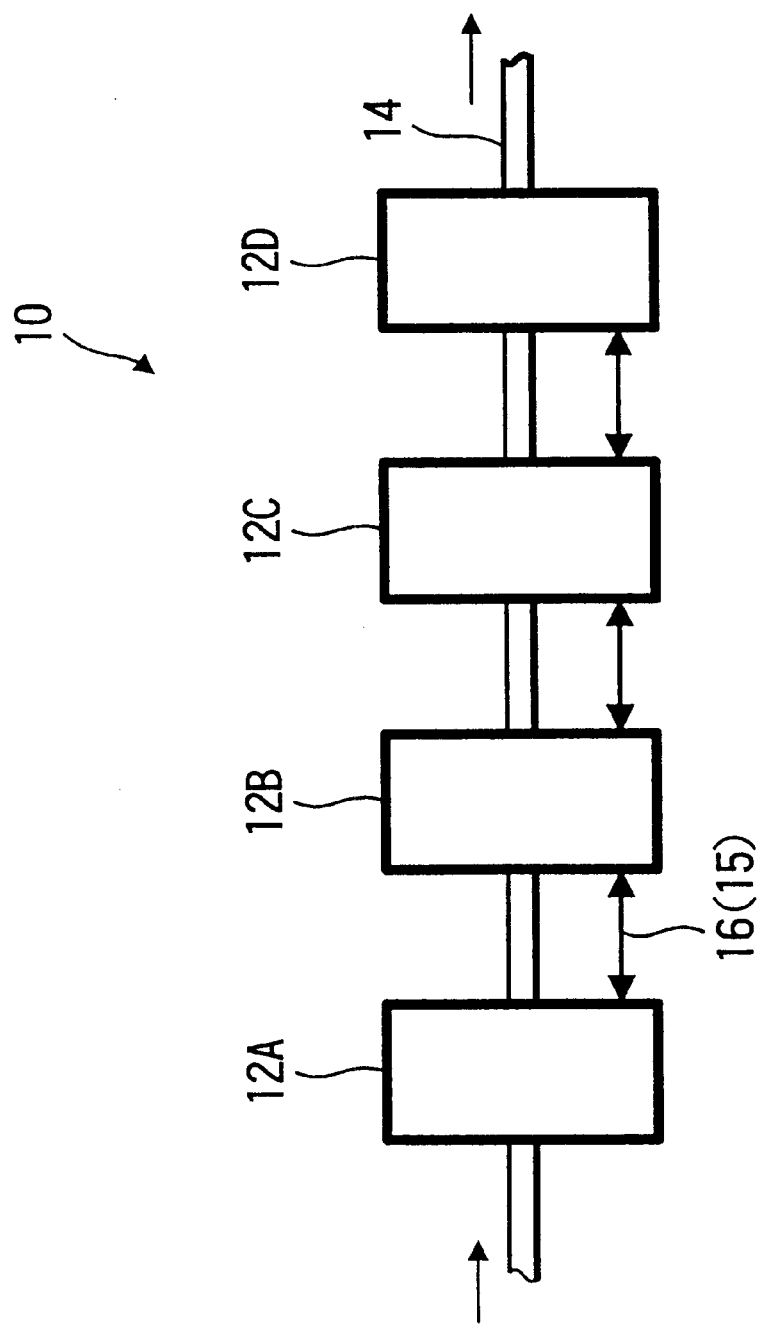
FIG. 2 is a block diagram illustrating the constitution of an apparatus for mounting electronic parts according to an embodiment.
Figure 3:
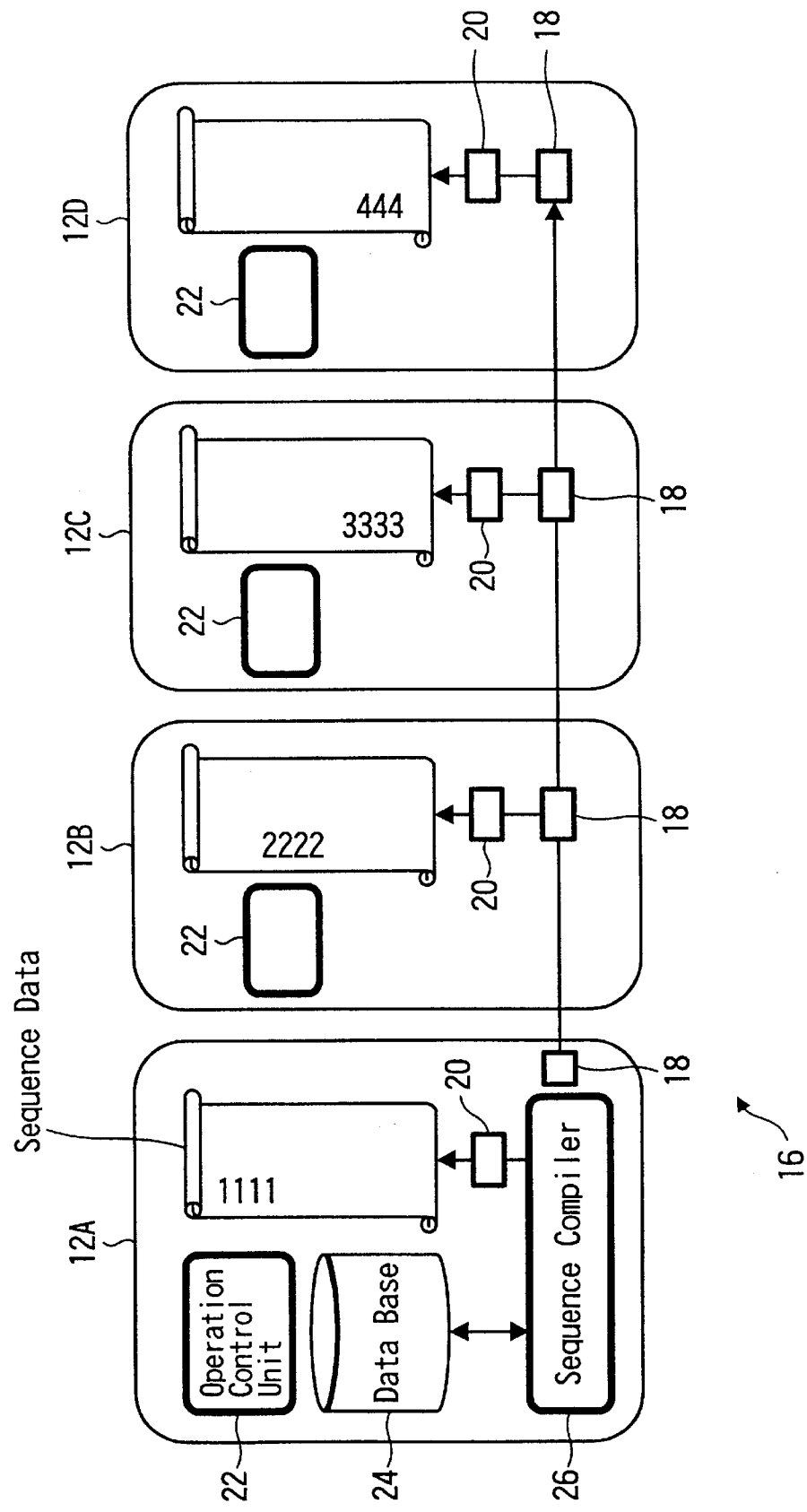
FIG. 3 is a block diagram illustrating a circuit of sequence data.

FIG. 2 is a block diagram illustrating the constitution of an apparatus for mounting electronic parts according to the embodiment of the invention, and FIG. 3 is a block diagram illustrating a circuit of sequence data.

Referring to FIG. 2, the apparatus 10 for mounting electronic parts of the embodiment comprises a plurality of electronic parts-mounting units 12A to 12D (FIG. 2 illustrates four units only), a conveyer means 14 for successively conveying the mounting boards from an electronic parts-mounting unit 12 to a next electronic parts-mounting unit 12, and a communications system 16 for communication among the electronic parts-mounting units 12 via a network cable 15.

The electronic parts-mounting units 12A to 12D are allocated with machine logic numbers that have been set in advance, such as, 1, 2, 3 and 4, and are further provided, as shown in FIG. 2, with communication units 18 for inputting/outputting data to and from the communications system 16, selection filters 20 for selectively obtaining sequence data related to the machine logic number that has been set out of the sequence data inputted at the communication units 18, and operation control units 22 for controlling the operation for mounting the electronic parts based on the sequence data obtained at the selection filters 20.

Except for the above-mentioned constitution, the electronic parts-mounting units 12 are of the same constitution as the conventional electronic parts-mounting units. Further, the conveyer means 14 has the same constitution as that of the case of the conventional apparatus for mounting electronic parts.

In this embodiment, one electronic parts-mounting unit works as a parent unit among the four electronic parts-mounting units 12A to 12D, e.g., the electronic parts-mounting unit 12A in FIG. 2 works as a parent unit to receive the systematic control function of the whole apparatus 10 for mounting electronic parts. Further, the electronic parts-mounting unit 12A itself and other electronic parts-mounting units 12B to 12D are dependent upon the parent unit.

The electronic parts-mounting unit 12A which is the parent unit further includes a data base 24 storing a plurality of sequence data, and a sequence compiler 26 incorporating a link control soft program for controlling the electronic parts-mounting units 12A to 12D that are child units.

In this embodiment, the electronic parts-mounting unit 12A is equipped with the data base 24 and the sequence compiler 26 to work as a parent unit. However, the electronic parts-mounting unit 12B could become a parent unit when it is equipped with the data base 24 and the sequence compiler 26. When a plurality of electronic parts-mounting units, e.g., the electronic part mounting units 12A, 12B and 12C are equipped with the data base 24 and the sequence compiler 26, respectively, any one of these electronic parts-mounting units 12A, 12B and 12C declares to be a parent unit.

The electronic parts-mounting unit 12A which is the parent unit sends the sequence data to the electronic parts-mounting units 12B to 12D which are child units through the network cable 15 of the communications system 16. The electronic parts-mounting units 12B to 12D which are the child units pick up from among the sequence data those portions that meet the machine logic numbers through the selection filters 20, and execute the mounting operations according to the sequence data.

In this embodiment, the sequence data to be sent to the electronic parts-mounting units 12 comprise the sequence data of a conventional constitution but attached with the machine logic numbers (cell numbers), and are, for example, as follows:

| Step No. | Cell No. | X-coordinate | Y-coordinate | R (rotational angle) | Part No. |
| --- | --- | --- | --- | --- | --- |
| 1 | 1 | 10 | 10 | 0 | A1000 |
| 2 | 1 | 10 | 15 | 90 | A1000 |
| 3 | 2 | 20 | 10 | 0 | A1001 |
| 4 | 2 | 20 | 15 | 90 | B1002 |
| 5 | 3 | 50 | 30 | 0 | C1010 |
| 6 | 3 | 100 | 100 | 45 | D1100 |
| 7 | 4 | 150 | 50 | 0 | D1200 |
| 8 | 4 | 160 | 80 | 0 | D1300 |

According to the above-mentioned sequence data, the mounting operation executed by the apparatus 10 for mounting electronic parts is constituted by the following eight steps of a step 1 to a step 8.

At the step 1, a part of a number A1000 (semiconductor device) is mounted by the electronic parts-mounting unit 12A on the mounting board at a position of coordinates (10, 10) at a rotational angle of 0° with respect to a reference line.

At the step 2, a part of a number A1000 (the same kind of semiconductor device as that of the step 1) is mounted by the electronic parts-mounting unit 12A on the mounting board at a position of coordinates (10, 15) at a rotational angle of 90° with respect to the reference line.

At the step 3, a part of a number A1001 (resistor) is mounted by the electronic parts-mounting unit 12B on the mounting board at a position of coordinates (20, 10) at a rotational angle of 0° with respect to the reference line.

At the step 4, a part of a number B1002 (capacitor) is mounted by the electronic parts-mounting unit 12B on the mounting board at a position of coordinates (20, 15) at a rotational angle of 90° with respect to the reference line.

Similarly, the steps 5 to 8 are executed.

Upon assigning the machine logic numbers 1 to 4 to the electronic parts-mounting units 12A to 12D, the above-mentioned sequence data for the electronic parts-mounting units 12 turn into operation sequences as tabulated below.

| Name of electronic parts-mounting unit | Machine logic No. | Steps to be executed |
|---|---|---|
| 12A | 1 | 1, 2 |
| 12B | 2 | 3, 4 |
| 12C | 3 | 5, 6 |
| 12D | 4 | 7, 8 |

If the machine logic numbers are exchanged between the electronic parts-mounting units 12A and 12B, then, the steps to be executed become as tabulated below.

| Name of electronic parts-mounting unit | Machine logic No. | steps to be executed |
|---|---|---|
| 12A | 2 | 3, 4 |
| 12B | 1 | 1, 2 |
| 12C | 3 | 5, 6 |
| 12D | 4 | 7, 8 |

Thus, by using the same sequence data, the step sequence of the electronic parts-mounting units 12 can be set relying upon the machine logic numbers and, besides, the sequence can be quickly changed over among the electronic parts-mounting units 12.

The sequence compiler in the electronic parts-mounting unit 12 which is the parent unit calculates the allotment time and calculates the arrangement of sequences of the electronic parts-mounting units 12 maintaining good balance by taking the set conditions of the electronic parts-mounting units 12 into consideration. The results of the calculation are written into the cell No. region of sequence data to execute the function.

According to the present invention, there is realized an apparatus for mounting electronic parts constituted by a plurality of electronic parts-mounting units linked together, each of which comprising a communications unit for inputting/outputting data to and from the communications system, a selection filter for selectively obtaining sequence data related to the preset machine logic numbers from the input sequence data, and an operation control unit for controlling the operation for mounting the electronic parts based on the sequence data that are obtained. The same sequence data are down-loaded on the electronic parts-mounting units to manage the plurality of the electronic parts-mounting units as a single apparatus.

To replace the allocation of sequence data among the electronic parts-mounting units, the machine logic numbers set for the electronic parts-mounting units are exchanged to quickly change over the electronic parts-mounting units.

Thus, there is realized an apparatus for mounting electronic parts featuring a broad compatibility in the mounting operations of the electronic parts-mounting units, excellent versatility in the mounting operations and high production efficiency.

Having described preferred embodiments of the present invention with reference to the accompanying drawings, it is to be understood that the present invention is not limited to the above-mentioned embodiments and that various changes and modifications can be effected therein by one skilled in the art without departing from the spirit or scope of the present invention as defined in the appended claims.

What is claimed is:

1. An apparatus for mounting electronic parts comprising:

a plurality of electronic parts-mounting units for mounting predetermined electronic parts on a mounting board at predetermined positions;

a communications means for connecting said plurality of electronic parts-mounting units; and an operation control unit for outputting machine logic numbers and data for mounting said predetermined electronic parts of each of said mounting units, said outputting being made to said communication means, said mounting units being controlled by specifying the machine logic number and the data for mounting said predetermined electronic parts for each of the units.

2. The apparatus for mounting electronic parts according to claim 1, wherein one of the electronic parts-mounting units connected together is selected as a parent unit, and electronic parts-mounting units other than the parent unit are used as child units so as to be made to cooperate with the parent unit.

3. The apparatus for mounting electronic parts according to claim 2, wherein the parent unit includes a sequence compiler which allocates sequence data to the child units based on the machine logic numbers and contains a link control soft program, wherein the same sequence data are transmitted to all child units as well as the parent unit, and the child units read the portions that meet their own machine logic numbers from among the sequence data through selection filters to execute the sequence.

4. The apparatus for mounting electronic parts according to any one of claims 1 to 3, wherein the machine logic numbers sent to the electronic parts-mounting units may be changed.

5. The apparatus for mounting electronic parts according to claim 1, wherein sequence control may be changed, where any one of the plurality of electronic parts-mounting units works as a parent unit and the other electronic parts-mounting units work as child units, the electronic parts-mounting units all working independently of each other.

6. An apparatus for mounting electronic parts comprising:

a plurality of electronic parts-mounting units for mounting predetermined electronic parts on a mounting board at predetermined positions;

a communicating means for connecting said plurality of electronic parts-mounting units; and operation control units for controlling the parts mounting operations of each of said mounting units, the mounting operations of said mounting units being controlled by specifying the machine logic number and the data for mounting electronic parts for each of the units, the machine logic numbers and data being outputted to said communication means;

wherein one of the electronic parts-mounting units functions as a parent unit which operates as the operational control unit for all the electronic parts-mounting units, and electronic parts-mounting units other than the parent unit are used as child units so as to cooperate with the parent unit.

* * * * *